United States Patent
Wann et al.

(10) Patent No.: US 8,716,863 B2
(45) Date of Patent: May 6, 2014

(54) STRUCTURE AND METHOD FOR HIGH PERFORMANCE INTERCONNECT

(75) Inventors: Hsingjen Wann, Carmel, NY (US); Ting-Chu Ko, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 167 days.

(21) Appl. No.: 13/182,368

(22) Filed: Jul. 13, 2011

(65) Prior Publication Data
US 2013/0015581 A1    Jan. 17, 2013

(51) Int. Cl.
*H01L 23/48* (2006.01)
*H01L 29/40* (2006.01)
*H01L 23/52* (2006.01)
*H01L 21/02* (2006.01)

(52) U.S. Cl.
USPC ............ 257/746; 257/478; 257/774; 257/776

(58) Field of Classification Search
CPC .............. H01L 21/786; H01L 21/8221; H01L 21/823425; H01L 21/823421; H01L 23/481; H01L 23/528
USPC ................... 257/751, 746, 774, 776, 478, 473
See application file for complete search history.

(56) References Cited

U.S. PATENT DOCUMENTS

| 7,473,633 B2 | 1/2009 | Furukawa et al. | |
| 7,564,136 B2* | 7/2009 | Yeh et al. | 257/773 |
| 2002/0096778 A1* | 7/2002 | Cox | 257/774 |
| 2006/0118962 A1* | 6/2006 | Huang et al. | 257/760 |
| 2012/0006580 A1* | 1/2012 | Sandhu | 174/126.1 |
| 2012/0052680 A1* | 3/2012 | Sakuma et al. | 438/675 |

OTHER PUBLICATIONS

Yang Chai et al., Reliability Evaluation of Carbon Nanotube Interconnect in a Silicon CMOS Environment, International Conference on Electronic Materials and Packaging, 2006, pp. 1-5.
Yang Chai et al., "Carbon Nanotube/Copper Composites for Via Filing and Thermal Management", 57th Electronic Components and Technology Conference, 2007, pp. 1224-1229.
Yang Chai et al., "High Electromigration-Resistant Copper/Carbon Nanotube Composite for Interconnect Application", IEDM 2008, pp. 1-4.
Yang Chai et al., "Copper/Carbon Nanotube Composite Interconnect for Enhanced Electromigration Resistance", 58th Electronic Components and Technology, pp. 412-420.

* cited by examiner

*Primary Examiner* — George Fourson, III
*Assistant Examiner* — Wilner Jean Baptiste
(74) *Attorney, Agent, or Firm* — Haynes and Boone, LLP (57) ABSTRACT

The present disclosure provides an integrated circuit structure. The integrated circuit structure includes a substrate having an IC device formed therein; a first dielectric material layer disposed on the substrate and having a first trench formed therein; and a first composite interconnect feature disposed in the first trench and electrically coupled with the IC device. The first composite interconnect feature includes a first barrier layer disposed on sidewalls of the first trench; a first metal layer disposed on the first barrier layer; and a first graphene layer disposed on the metal layer.

14 Claims, 9 Drawing Sheets

STRUCTURE AND METHOD FOR HIGH PERFORMANCE INTERCONNECT

BACKGROUND

In semiconductor technology, an integrated circuit pattern can be formed on a substrate using various processes including a photolithography process, ion implantation, deposition and etch. Damascene processes are utilized to form multilayer copper interconnections including vertical interconnection vias and horizontal interconnection metal lines. During a damascene process, trenches are formed in a dielectric material layer, copper or tungsten is filled in the trenches, then a chemical mechanical polishing (CMP) process is applied to remove excessive metal on the dielectric material layer and planarize the top surface.

As the integrated circuit (IC) fabrication moves to advanced technology nodes, the IC feature size scales down to smaller dimensions. For example, the trench dimensions get smaller and smaller. Accordingly, the gap-filling ability of those metallic material is limited and the gap-filling quality and reliability are challenged. Further, the corresponding conductivity of the gap-filling metal is needed to be higher for desired performance of the interconnect structure. Thus, the interconnect material is a bottle neck for further improving the interconnect structure with required performance and reliability. Accordingly, a structure of interconnect structure and a method making the same are needed to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
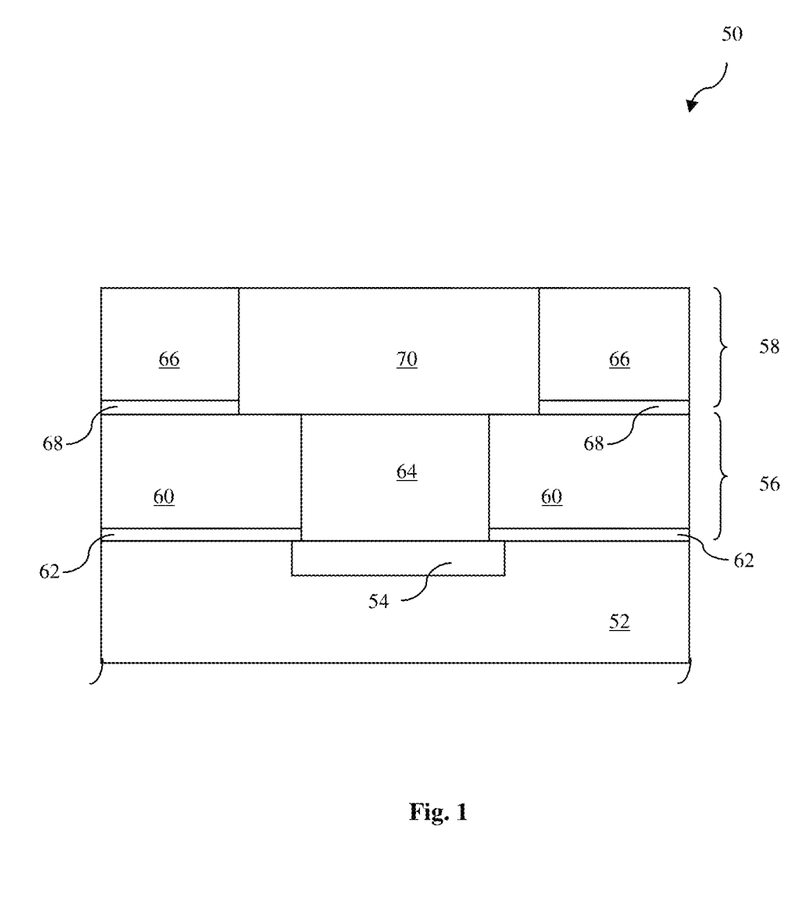
FIG. 1 illustrates a sectional view of a semiconductor structure having an interconnect structure constructed according to various aspects of the present disclosure in one or more embodiments.
Figure 2:
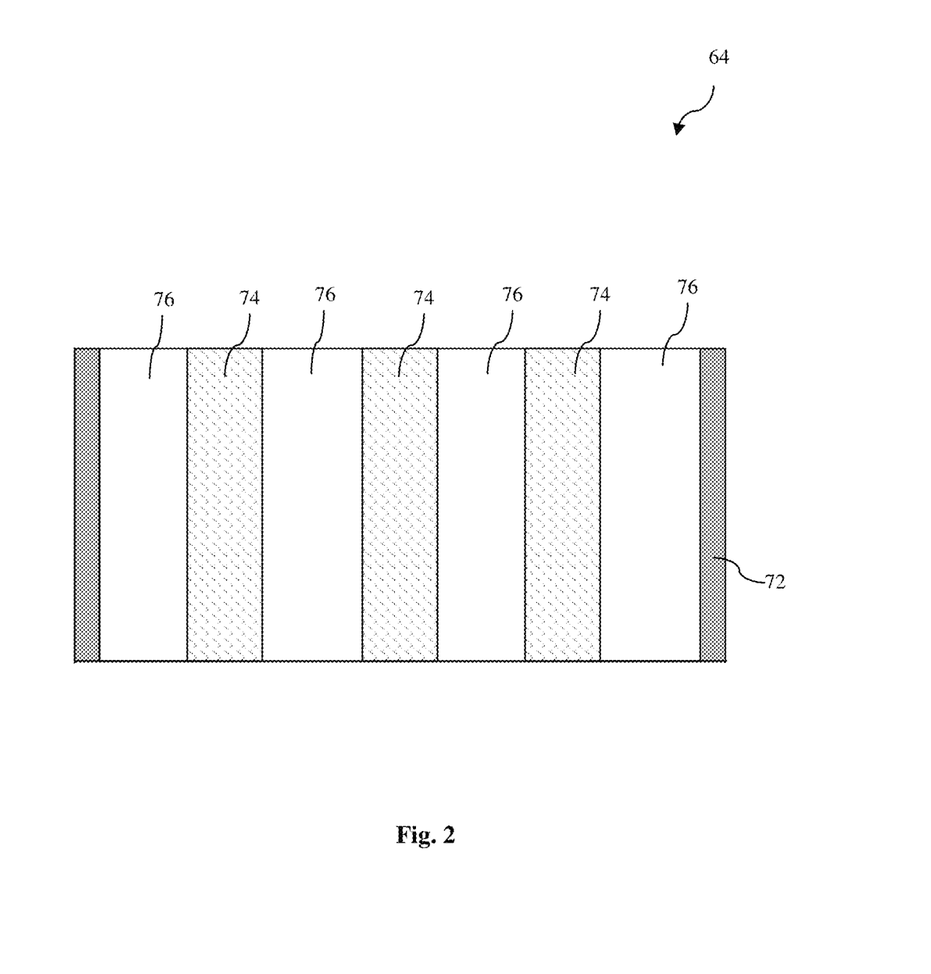
FIG. 2 illustrates a sectional view of one interconnect feature of the semiconductor structure of FIG. 1 constructed according to various aspects of the present disclosure in one or more embodiments.
Figure 3:
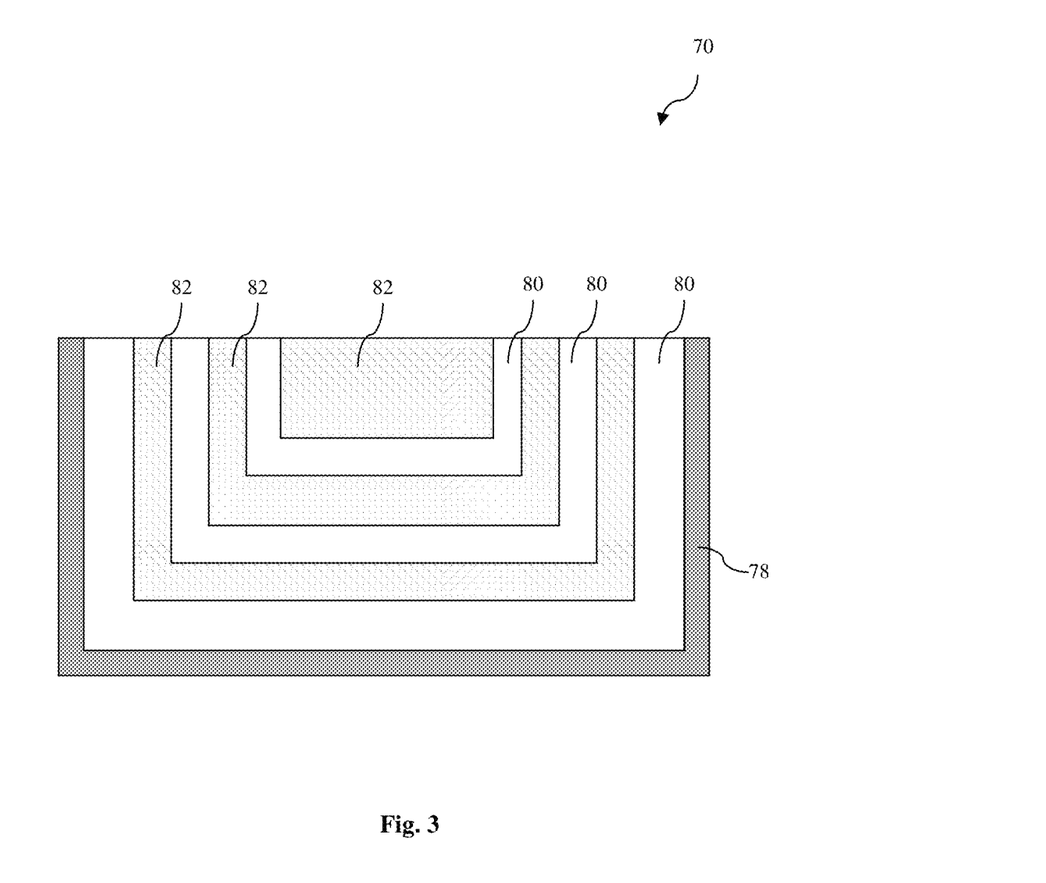
FIG. 3 illustrates a sectional view of another interconnect feature of the semiconductor structure of FIG. 1 constructed according to various aspects of the present disclosure in one or more embodiments.

FIG. 1 illustrates a sectional view of a semiconductor structure (or an integrated circuit structure) 50 having an interconnect structure constructed according to various aspects of the present disclosure in one or more embodiments. FIG. 2 illustrates a sectional view of one interconnect feature of the semiconductor structure 50 constructed according to various aspects of the present disclosure. FIG. 3 illustrates a sectional view of another interconnect feature of the semiconductor structure 50 constructed according to various aspects of the present disclosure. The semiconductor structure 50 is described below with reference to FIGS. 1 through 3.

Referring to FIG. 1, the semiconductor structure 50 includes a substrate 52. The substrate 52 includes silicon substrate. Alternatively, the substrate 52 may include other elementary semiconductor such as germanium. The substrate 52 may also include a compound semiconductor such as silicon carbide, gallium arsenic, indium arsenide, and indium phosphide. The substrate 52 may include an alloy semiconductor such as silicon germanium, silicon germanium carbide, gallium arsenic phosphide, and gallium indium phosphide. In one embodiment, the substrate 52 includes an epitaxial layer. For example, the substrate may have an epitaxial layer overlying a bulk semiconductor. Furthermore, the substrate 52 may include a semiconductor-on-insulator (SOI) structure. For example, the substrate may include a buried oxide (BOX) layer formed by a process such as separation by implanted oxygen (SIMOX) or other suitable technique, such as wafer bonding and grinding. The substrate 52 also includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 52 may further include other functional features such as a resistor or a capacitor formed in and on the substrate. The substrate 52 further include lateral isolation features provided to separate various devices formed in the substrate 52. In one embodiment, shallow trench isolation (STI) features are used for lateral isolation. The various devices further include silicide disposed on S/D, gate and other device features for reduced contact resistance when coupled to the output and input signals.

The semiconductor structure 50 also includes a plurality of patterned dielectric layers and patterned conductive features integrated to form an interconnect structure configured to couple the various p-type and n-type doped regions and the other functional features (such as gate electrodes), resulting a functional integrated circuit. In one example, the substrate 52 may include a portion of the interconnect structure and is collectively referred to as the substrate 52. The interconnect structure is further described later.

An exemplary conductive feature 54 is shown in FIG. 1 for illustration. In one embodiment, the conductive feature 54 is a source, drain or gate electrode. Alternatively, the conductive feature 54 is a silicide feature disposed on source, drain or gate electrode. The silicide feature may be formed by a self-aligned silicide (salicide) technique. In another embodiment, the conductive feature 54 includes an electrode of a capacitor or one end of a resistor. In yet another embodiment where the substrate 52 is a portion of the interconnect structure, the conductive feature 54 includes a contact, a metal via, or a metal line.

As noted above, the semiconductor structure 50 includes an interconnect structure. The interconnect structure includes a multi-layer interconnect (MLI) structure and an inter-level dielectric (ILD) integrated with the MLI structure, providing an electrical routing to couple various devices in the substrate 52 to the input/output power and signals. The interconnect structure includes various metal lines, contacts and metal vias. The metal lines provide horizontal electrical routing. The contacts provide vertical connection between silicon substrate and metal lines while vias provide vertical connection between metal lines in different metal layers.

In the present embodiment, the semiconductor structure 50 includes a first interconnect layer 56 and a second interconnect layer 58, as shown in FIG. 1. The first interconnect layer 56 includes a first dielectric material layer 60 disposed on the substrate 52. The first dielectric material layer 60 includes silicon oxide, a low dielectric constant (low-k) material, other suitable dielectric material, or a combination thereof. The low-k material may include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. A process to form the first dielectric material layer 60 may utilize chemical vapor deposition (CVD), spin-on coating, or other suitable technique.

An etch stop layer 62 may be additionally disposed between the substrate 52 and the first dielectric material layer 60. The etch stop layer 62 includes a dielectric material having an etch resistance significantly higher than the etch resistance of the first dielectric material layer 60 during an etch process to pattern the first dielectric material layer 60. In one example, the etch stop layer 62 includes silicon nitride, silicon carbide or other suitable material.

A first conductive feature 64 is embedded in the first dielectric material layer 60 and may be further embedded in the etch stop layer 62 if the etch stop layer 62 is present. The first conductive feature 64 is aligned with and is landing on the conductive feature 54. Particularly, the first conductive feature 64 contacts the conductive feature 54, providing an electrical path. In one embodiment, the first conductive feature 64 is a metal via between two neighbor metal layers or a contact between a metal layer and silicon substrate. In another embodiment, the first conductive feature 64 is formed by patterning the first dielectric material layer 60 to form a first trench, filling various conductive materials in the first trench, and performing a chemical mechanical polishing (CMP) process to remove various conductive materials on the first dielectric material layer 60. In one example, patterning the first dielectric material layer 60 includes a lithography process and an etching process. The lithography process forms a patterned photoresist layer having an opening that defines a region for the first trench. The etching process may include two etch steps to respectively remove the first dielectric material layer 60 and the etch stop layer 62 within the opening of the patterned photoresist layer. The patterned photoresist layer is removed by wet stripping or plasma ashing after the etching. Alternatively, a hard mask layer may be used as an etch mask in the process to form the first trench.

The first conductive feature 64 is further described with reference to FIG. 2 as a sectional view. The first conductive feature 64 includes a barrier layer 72 disposed on sidewalls of the first trench. The barrier layer 72 provides an effective prevention from metal diffusion into the first dielectric material layer 60. In one example, the barrier layer 72 includes tantalum nitride (TaN) and or tantalum (Ta). In other examples, the barrier layer 72 may include other suitable material, such as titanium nitride (TiN). The barrier layer 72 may be formed by physical vapor deposition (PVD) or other suitable technique. In another embodiment, the barrier layer 72 may be patterned such that the portion deposited on the bottom surface of the first trench is removed.

The first conductive feature 64 includes one or more carbon nanotubes (CNTs) disposed in the first trench. In the present embodiment, the CNTs are substantially oriented along a direction perpendicular to the substrate 52 (along the trench depth direction in other words). The CNTs start growing from the conductive feature 54 and end at the top surface of the first dielectric material layer 60. In one example, CNTs are randomly formed on the conductive feature 54. In present embodiment, the CNTs are formed by CVD. In other embodiments, the CNTs are formed by or other suitable technique, such as arc discharge, laser ablation, or high pressure carbon monoxide (HiPco). In various examples, CNTs 74 include single walled CNTs and/or multi-walled CNTs. In other examples, CNTs 74 may be semiconductor type CNTs or metallic type CNTs.

Then a metal material 76 is filled into gaps among the CNTs such that the first trench is filled and the CNTs 74 are embedded in the metal material 76. In one embodiment, the metal material 76 includes copper (Cu). In another embodiment, the metal material 76 includes tungsten (W). The metal material may include other suitable metal. The metal material 76 may be deposited by CVD using a CVD tool, such as Centura of Applied Materials.

In one embodiment of a CVD process to form the metal material 76 that contains copper, the corresponding precursor includes Cu-hexafluoroacetylacetonate (hfac) and trimethylvinylsilane (TMVS). During the CVD process, the substrate temperature ranges between about 100 C and about 550 C according to one example. The pressure in the corresponding CVD chamber ranges between about 1 mTorr and about 1500 mTorr in another example. The carrier gas may include hydrogen (H2), nitrogen (N2), argon (Ar), or combinations thereof.

In another embodiment of a CVD process to form the metal material 76 that contains copper, the precursor includes copper acetylacetonate (or Cu (acac)2). During the CVD process, the substrate temperature ranges between about 100 C and about 550 C in one example. The pressure in the corresponding CVD chamber ranges between about 1 mTorr and about 1500 mTorr in another example. In yet another example, the carrier gas includes H2, Ar, or combinations thereof.

In yet another embodiment of a CVD process to form the metal material 76 that contains copper, the precursor includes copper dipivaloylmethanate (or Cu-(dpm)2). During the CVD process, the substrate temperature ranges between about 100 C and about 550 C in one example. The pressure in the corresponding CVD chamber ranges between about 1 mTorr and about 1500 mTorr in another example. No carrier gas is used.

In yet another embodiment of a CVD process to form the metal material 76 that contains copper, the precursor includes Cu-(nona-F)2. During the CVD process, the substrate temperature ranges between about 100 C and about 550 C in one example. The pressure in the corresponding CVD chamber ranges between about 1 mTorr and about 1500 mTorr in another example. The carrier gas may include H2.

Other suitable technique, such as PVD or E-gun, may be alternatively implemented to deposit the metal material 76. In one embodiment, PVD is used to deposit the metal material 76 that contains copper. Applied Materials PVD tool Endura may be used to deposit copper using a copper target. Provided below are various parameters of the PVD process to deposit copper, according to various examples. The sputtering power ranges between about 10 kW and about 100 kW. The sputtering duration ranges between about 20 seconds and about 120 seconds. The sputtering temperature ranges between room temperature and about 50 C. The sputtering bias power ranges between 0 and about 1200 W. The electron magnet power ranges between 0 and about 50 Amps. The carrier gas includes argon. The PVD chamber pressure ranges between about 1 mTorr and about 100 mTorr.

In another embodiment, E-gun technique is used to deposit copper. Provided below are various features parameters of the E-gun process to deposit copper, according to various examples. A tungsten crucible is used to hold copper source. A current is applied between two electrodes of the crucible to heat the copper source to a temperature greater than about 1100 C. The work piece (e.g., the semiconductor structure 50) is held on top of crucible. Thus, the copper source is evaporated and deposited on the work piece.

In the present embodiment, both the CNTs 74 and the metal material 76 are formed by CVD using a same CVD tool to reduce manufacturing cycle time. For example, Applied Materials CVD tool Centura is used to form the CNTs 74 and the metal material 76. Thereafter, a CMP process may be additionally applied to remove metal material on the first dielectric material and to remove excessive CNTs above the top surface of the first dielectric material layer. Particularly, the density of CNTs 74 are controlled to a level by process such that there are enough gaps among the CNTs and the metal material can be effectively filled in. Due to material characteristics, the combination of the metal material and CNTs enhances the gap filling capability, especially for trenches with high aspect ratios.

Referring back FIG. 1, the second interconnect layer 58 includes a second dielectric material layer 66 disposed on the first dielectric material layer 60. The second dielectric material layer 66 includes silicon oxide, a low dielectric constant (low-k) material, other suitable dielectric material or a combination thereof. In the present embodiment, the second dielectric material layer 66 is similar to the first dielectric material layer 60 in terms of composition and formation. For example, the second dielectric material layer 66 is formed by chemical vapor deposition (CVD), spin-on coating, or other suitable technique.

An etch stop layer 68 may be additionally disposed between the second dielectric material layer 66 and the first dielectric material layer 60. The etch stop layer 68 includes a dielectric material having an etch resistance significantly higher than the etch resistance of the second dielectric material layer 66 during an etch process to pattern the second dielectric material layer 66. In one embodiment, the etch stop layer 68 is similar to the etch stop layer 60 in terms of composition and formation. For example, the etch stop layer 68 includes silicon nitride, silicon carbide or other suitable material.

A second conductive feature 70 is embedded in the second dielectric material layer 66 and may be further embedded in the etch stop layer 68 if the etch stop layer 68 is present. The second conductive feature 70 is aligned with and is landing on the first conductive feature 64. Particularly, the second conductive feature 70 contacts the first conductive feature 64, providing an electrical path. In one embodiment, the second conductive feature 70 is a metal line. In another embodiment, the second conductive feature 70 is formed by patterning the second dielectric material layer 66 to form a second trench, filling in various conductive materials in the second trench, and performing a chemical mechanical polishing (CMP) process to remove the conductive materials on the second dielectric material layer 66. In one example, patterning the second dielectric material layer 66 includes a lithography process and an etching process. The lithography process forms a patterned photoresist layer having an opening that defines a region for the second trench. The etching process may include two etch steps to respectively remove the second dielectric material layer 66 and the etch stop layer 68 within the opening of the patterned photoresist layer. The patterned photoresist layer is removed after the etching process.

The second conductive feature 70 is further described with reference to FIG. 3 as a sectional view. The second conductive feature 70 includes a barrier layer 78 disposed on bottom surface and sidewalls of the second trench for prevention metal diffusion into the second dielectric material layer 66. In the present embodiment, the barrier layer 78 is similar to the barrier layer 72 in term of composition and formation. In one example, the barrier layer 78 includes TaN and/or Ta. In other examples, the barrier layer 78 may include other suitable material, such as TiN. The barrier layer 78 may be formed by PVD or other suitable technique.

The second conductive feature 70 includes metal material 80 and graphene 82 integrated in a multilayer structure. Graphene is a two dimensional (2D) carbon structure. Graphene is one atom thick planar sheet of carbon atoms densely packed in a honeycomb crystal lattice (or simply referred to as graphene sheet).

In the present embodiment illustrated in FIG. 3, the second conductive feature 70 includes a plurality of metal layers (collectively labeled as 80) and a plurality of graphene layers (collectively labeled as 82) configured such that each graphene layer is interposed between the two neighbor metal layers. In the present embodiment, the first metal layer 80 is the outmost layer contacting the barrier layer 78. In an alternative embodiment, the first graphene layer 82 is the outmost layer contacting the barrier layer 78.

In one embodiment, the graphene layers 82 are formed by CVD. In one example, the precursor includes methane (CH4) and hydrogen (H2). During the CVD process, the gas flow and the substrate temperature are designed such that graphene can be efficiently grown on copper with better material integration. The CVD process may include multiple steps. In the present embodiment, the CVD process includes four steps. The step 1 only uses H2 gas and heats the substrate to a target deposition temperature with a first duration; the step 2 uses H2 gas and maintains the substrate at the target deposition temperature for a second duration; the step 3 uses H2 and CH4 for graphene deposition at the target deposition temperature. The gas CH4 and H2 are maintained with a gas flow ratio CH4/H2 grater than one; and step 4 the substrate is cooled down. During maintaining the substrate at the target deposition temperature at step 2 and deposition at step 3, the CVD deposition chamber is maintained at a pressure ranging between about 1 Torr and about 4 Torr. The target deposition temperature ranges between about 400 C and about 1000 C.

In one embodiment, the metal layers 80 include copper, tungsten or other suitable metal. In another embodiment, the metal layers 80 are deposited by CVD. Other suitable technique, such as PVD or E-gun, may be alternatively implemented to deposit the metal layers 80. The metal layers 80 that contains copper may be formed by one of the methods to form the metal material 76 described above in various embodiments.

The metal layers 80 and graphene layers 82 in multilayer structure fill in the second trench lined by the barrier layer 78. In the present embodiment, both the metal layers 80 and the graphene layers 82 are formed by CVD using a same CVD tool to reduce manufacturing cycle time, especially considering multiple the metal layers 80 and the graphene layers 82 to be formed. For example, Applied Materials Centura is used to respectively form the graphene layers 82 and the metal layers 80. Thereafter, a CMP process may be additionally applied to remove metal layers and the graphene layers disposed on the second dielectric material layer 66.

In one embodiment, each graphene layer includes one graphene sheet. Each graphene layer 82 includes a bottom portion and a sidewall portion. In another embodiment, each metal layer 80 has a respective thickness different from those of other metal layers 80. Particularly, a metal layer 80 is thinner when getting closer to the center of the second trench. In one procedure to form the second conductive feature 70, the barrier layer 78 is first deposited in the second trench, then a first metal layer 80 is deposited on the barrier layer 78, then a first graphene layer 82 is deposited on the first metal layer, then a second metal, and then a second graphene layer, and so on until the second trench is substantially filled thereby. In one example, the last layer is a metal layer 80. Due to the material interaction, the combination of the metal layers 80 and graphene layers 82 enhances the gap filling capability, especially for trenches with high aspect ratios.

In an alternative embodiment, the outmost layer adjacent the barrier layer 78 is a graphene layer 82. In this case, an interfacial material layer is disposed between the graphene layer and the barrier layer for better material integration. In one example, the interfacial material layer includes ruthenium (Ru).

Although the semiconductor structure 50 and the method of making the same are collectively described above, other embodiments or alternatives may be used. In one alternative embodiment, the first conductive feature 64 in the first interconnect layer 56 includes the CNTs 74 embedded in the metal layer 76 that contains copper, and the second conductive feature 70 in the second interconnect layer 58 also includes a structure similar to the first conductive feature 64. Particularly, the second conductive feature 70 includes CNTs in the second trench, oriented in the trench depth direction, and embedded in a copper metal layer. In furtherance of the embodiment, the first conductive feature 64 is via and the second conductive feature 70 is a metal line.

Further in this embodiment, the first and second conductive features 64 and 70 can be formed by two single damascene processes each being same or similar to the procedure to form the first conductive feature 64. Alternatively, the first and second conductive features 64 and 70 may be formed by a dual damascene process. In one example of the formation, the etch stop layer 62 is then deposited on the substrate, the first dielectric material layer 60 is deposited on the etch stop layer 62, the etch stop layer 68 is then deposited on the first dielectric material layer 60 and the second dielectric material layer 66 is deposited on the etch stop layer 68. The second trench is formed by a first patterning procedure including lithography process and etching, and thereafter the first trench is formed by a second patterning procedure. Or, the first trench is formed by a first patterning procedure, and thereafter the second trench is formed by a second patterning procedure. The first and second trenches are referred to as a collective trench here. Then CNTs are continuously grown in the collective trench (including the first and second trenches). A copper layer is filled in the gaps among the CNTs in the collective trench. Then a CMP process is applied to remove excessive metal and the CNTs above the top surface of the second dielectric material layer 66. In etching each trench, the corresponding underlying etch stop layer serves to stop the etch, then another etch, such as wet etching, may be used to open the respective etch stop layer.

Figure 4:
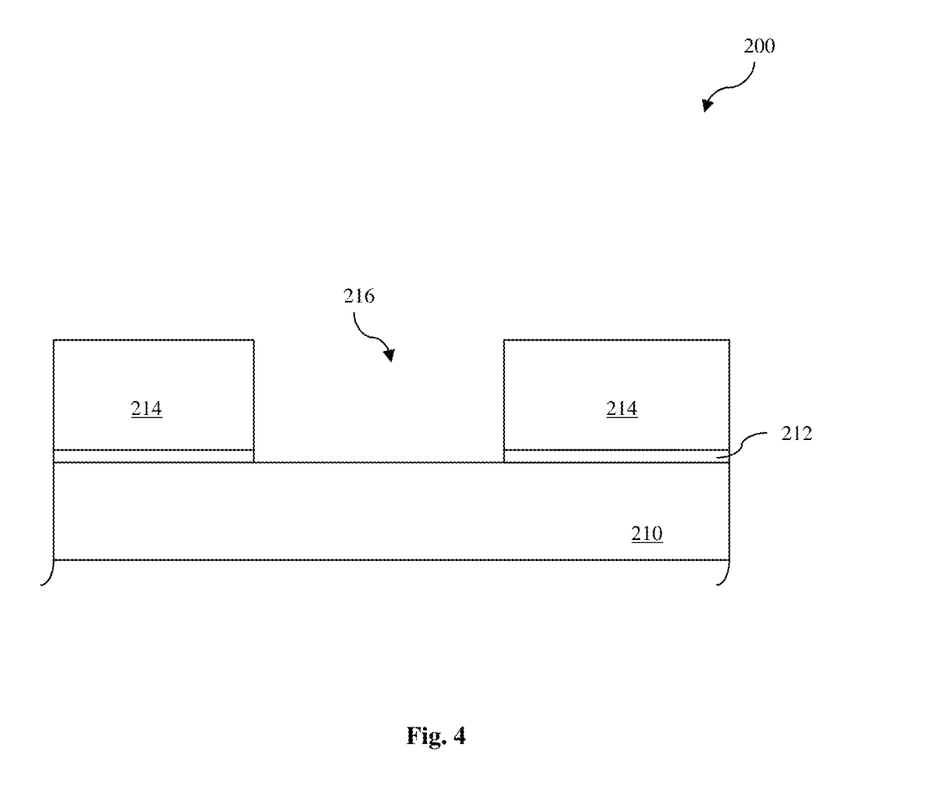
FIGS. 4 and 5 illustrate sectional views of an exemplary semiconductor structure during various fabrication stages constructed according to various aspects of the present disclosure in one or more embodiments.
Figure 5:
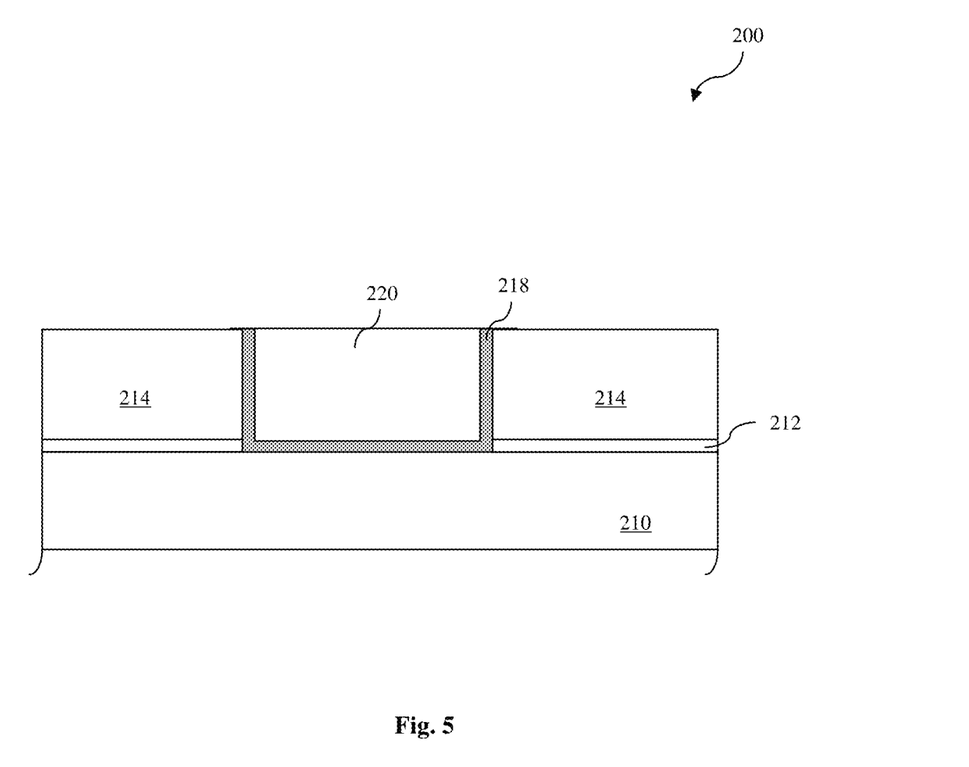

Below provided are other embodiments of a semiconductor structure and the corresponding method according to the present disclosure. FIGS. 4 and 5 illustrate sectional views of a semiconductor structure 200 at various fabrication stages constructed according to various aspects of the present disclosure in one or more embodiments. The semiconductor structure 200 and the method of making the same are collectively described with reference to FIGS. 4 and 5.

Referring to FIG. 4, the semiconductor structure 200 includes a substrate 210 similar to the substrate 52. The semiconductor structure 200 further includes an etch stop layer 212 disposed on the substrate 210 and a dielectric material layer 214 disposed on the etch stop layer 212. The etch stop layer 212 and the dielectric material layer 214 are similar to the etch stop layer 68 and the second dielectric material layer 66 in terms of composition and formation. For example, the dielectric material layer 214 includes a low-k dielectric material.

Then the dielectric material layer 214 is patterned to form a trench 216 by a procedure including a lithography process and etching. The lithography process forms a patterned photoresist layer and the etching is thereafter implemented using the patterned photoresist layer as an etch mask. The patterned photoresist layer is removed by wet stripping or plasma ashing. An exemplary lithography process may include processing steps of photoresist coating, soft baking, mask aligning, exposing pattern, post-exposure baking, developing photoresist, and hard baking. Lithography process may also be implemented or replaced by other proper methods such as maskless photolithography, electron-beam writing, ion-beam writing, and molecular imprint. In one example, a second etching step is implemented to remove the etch stop layer 212 within the trench 216 after the etching applied to the dielectric material layer 214. Thus, the trench 216 is defined in both The etch stop layer 212 and the dielectric material layer 214.

In another alternative embodiment, a hard mask is used to form the trench 216. For example, a hard mask layer is deposited on the dielectric material layer 214 and is patterned to have an opening defining a region for the trench 216. Then the hard mask layer is used as an etch mask during the etching process to pattern the dielectric material layer 214.

Referring to FIG. 5, a barrier layer 218 is disposed on bottom surface and sidewalls of the trench 216 to effectively prevent metal diffusion into the dielectric material layer 214. In the present embodiment, the barrier layer 218 is similar to the barrier layer 72 in term of composition and formation. In one example, the barrier layer 218 includes TaN, Ta or a combination thereof. In other examples, the barrier layer 218 may include other suitable material, such as TiN. The barrier layer 218 can be formed by PVD, CVD, or other suitable technique. Alternatively, the barrier layer 218 on the bottom surface of the trench 216 is selectively removed by a dry etch or a patterning process including lithography and etching.

Then a composite metal feature 220 is formed in the trench 216 and separated from the dielectric material layer 214 by the barrier layer 218. The composite metal feature 220 includes metal material and graphene integrated in a multi-layer structure. The composite metal feature 220 is similar to the integrated structure of multiple metal layers and multiple graphene layers in the second conductive feature 70 of FIG. 3 in terms of composition, formation and configuration. The composite metal feature 220 includes a plurality of metal layers 80 and a plurality of graphene layers 82 configured such that each graphene layer is interposed between the two neighbor metal layers, as illustrated in FIG. 3. Particularly, in the present embodiment, the outmost layer of the composite metal feature 220 is one of the metal layers 80.

In one embodiment, the metal layers 80 include copper (Cu) or tungsten (W). In another embodiment, each of the graphene layers 82 includes one atomic thick graphene sheet. In one embodiment, the graphene layers are formed by CVD. In another embodiment, the metal layers 80 are formed by CVD as well. Other suitable technique, such as physical vapor deposition (PVD) and/or plating, may be alternatively used to form the metal layers 80. Other suitable technique, such as arc discharge, may be used to form the graphene layers 82.

In the present embodiment, both the metal layers 80 and the graphene layers 82 are formed by CVD using a same CVD tool to reduce manufacturing cycle time. For example, Applied Materials CVD tool Centura is used to respectively form the graphene layers 82 and the metal layers 80. Thereafter, a CMP process may be additionally applied to remove metal layers and the graphene layers disposed on the dielectric material layer 214.

FIGS. 6 through 9 illustrate sectional views of a semiconductor structure 250 at various fabrication stages constructed according to various aspects of the present disclosure in other embodiments. The semiconductor structure 250 is similar to the semiconductor structure 50 of FIG. 1. The semiconductor structure 250 and the method making the same are collectively described below.

Figure 6:
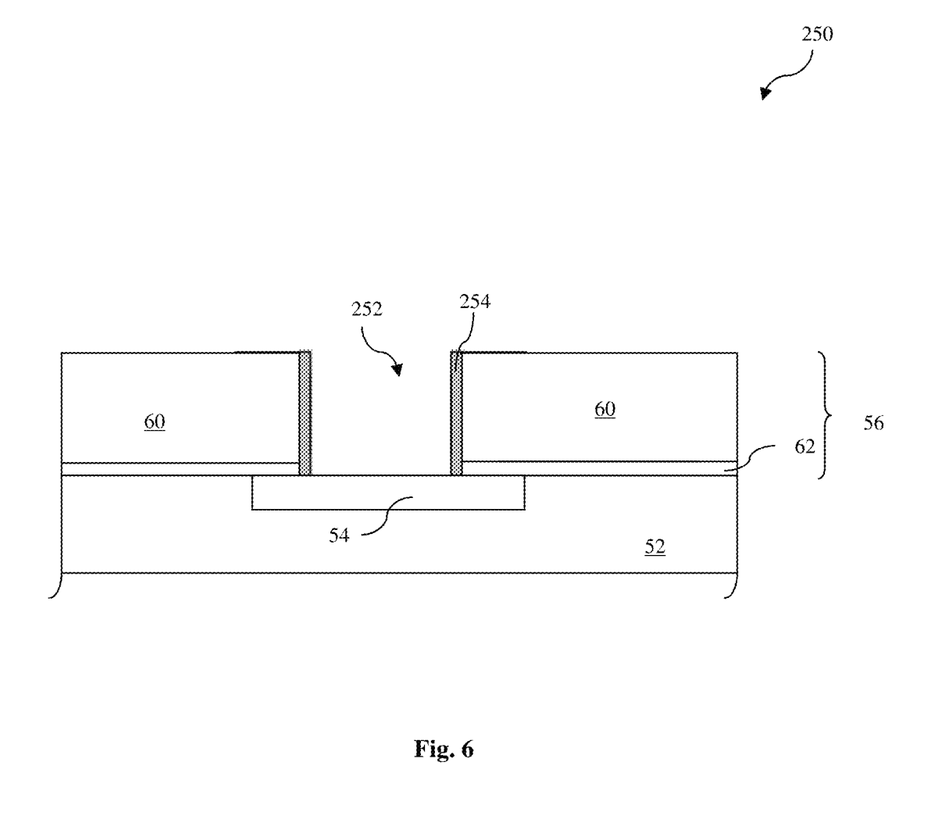
FIGS. 6 through 9 illustrate sectional views of an exemplary semiconductor structure during various fabrication stages constructed according to various aspects of the present disclosure in other embodiments.

Referring to FIG. 6, the semiconductor structure 250 includes a substrate 52 similar to the substrate 52 of FIG. 1. The semiconductor structure 250 further includes a conductive feature 54 similar to the conductive feature 54 of FIG. 1. The semiconductor structure 250 includes an interconnect layer 56 disposed on the substrate 52. The interconnect layer 56 includes an etch stop layer 62 disposed on the substrate 52 and a first dielectric material layer 60 disposed on the etch stop layer 62. The etch stop layer 62 and the first dielectric material layer 60 are similar to the etch stop layer 62 and the first dielectric material layer 60 of FIG. 1, respectively, in terms of composition, configuration and formation.

Then the first dielectric material layer 60 is patterned to form a trench 252 by a procedure including a lithography process and etching. In one example, two etching steps are implemented to respectively remove the first dielectric material layer 60 and the etch stop layer 62 within the trench 252. In an alternative embodiment, a hard mask is used to form the trench 252. The trench 252 is aligned with the conductive feature 54 and expose at least a portion of the conductive feature 54.

A barrier layer 254 is disposed on sidewalls of the trench 252 to effectively prevent metal diffusion into the first dielectric material layer 60. In the present embodiment, the barrier layer 254 is similar to the barrier layer 72 in term of composition and formation. In one example, the barrier layer 254 includes TiN, or alternatively includes other suitable material, such as TaN. The barrier layer 254 may be formed by PVD, CVD, or other suitable technique. In one embodiment, the barrier layer 254 disposed on the bottom surface of the trench 252 is selectively removed by a dry etch or a patterning process including lithography and etching.

Figure 7:
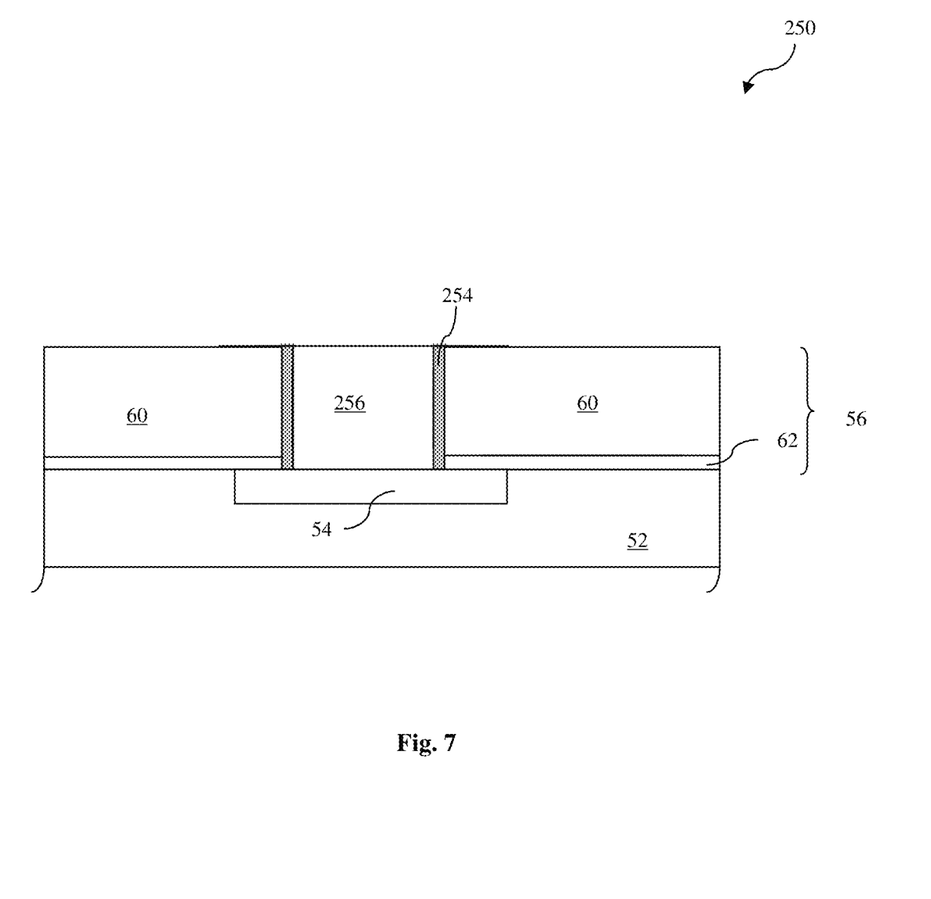

Referring to FIG. 7, a first composite metal feature 256 is formed in the trench 252 and separated from the first dielectric material layer 60 by the barrier layer 254. The first composite metal feature 256 and the barrier layer 254 are similar to the first conductive feature 64 in FIG. 2 in terms of composition, formation and configuration. The first composite metal feature 256 includes a metal layer 76 embedded with one or more CNTs 74. The first composite metal feature 256 is formed by first growing the CNTs in the first trench 252 and filling in the gaps among the CNTs. A CMP process may be further implemented to remove the excessive metal material and CNTs.

Figure 8:
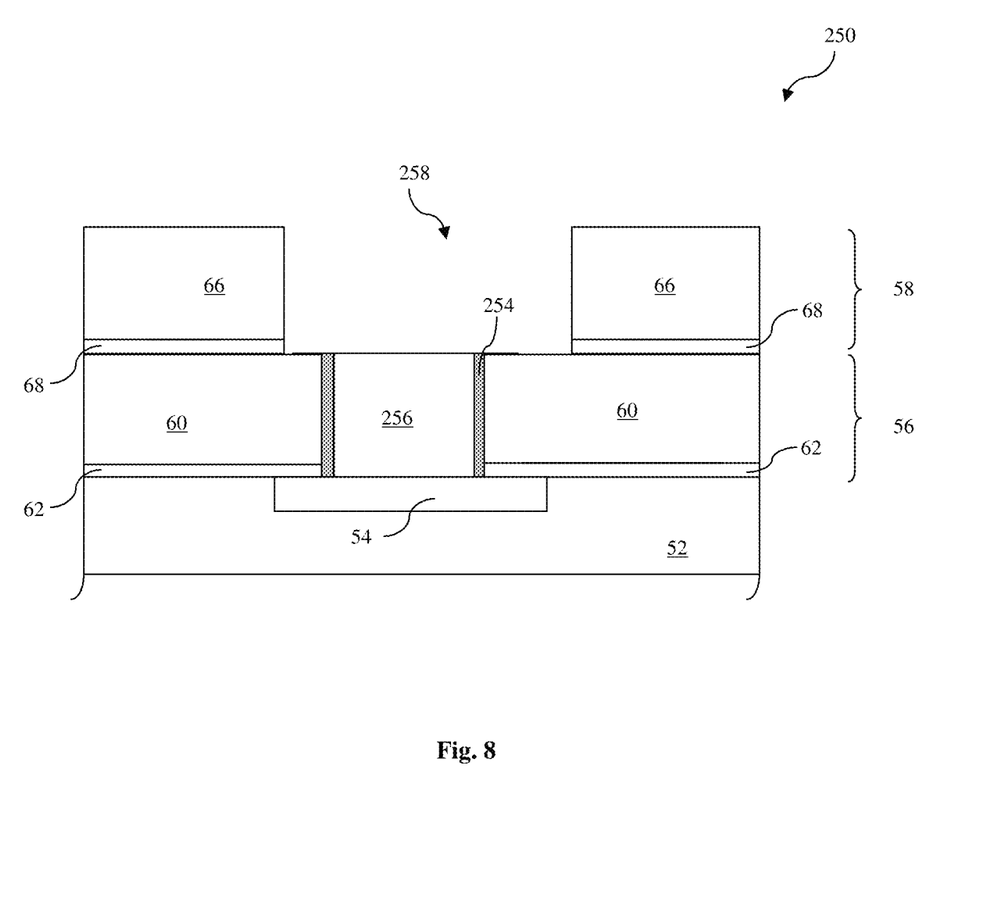

Referring to FIG. 8, the semiconductor structure 250 further includes a second interconnect layer 58 disposed on the first interconnect layer 56. The second interconnect layer 58 includes an etch stop layer 68 disposed on the first interconnect layer 56 and a second dielectric material layer 66 disposed on the etch stop layer 68.

Then the dielectric material layer 66 is patterned to form a second trench 258 by a procedure including a lithography process and etching. In one example, the etch stops at the etch stop layer 68 and then a second etching step is implemented to remove the etch stop layer 68 within the trench 258. A hard mask may be alternatively used to form the trench 258.

Figure 9:
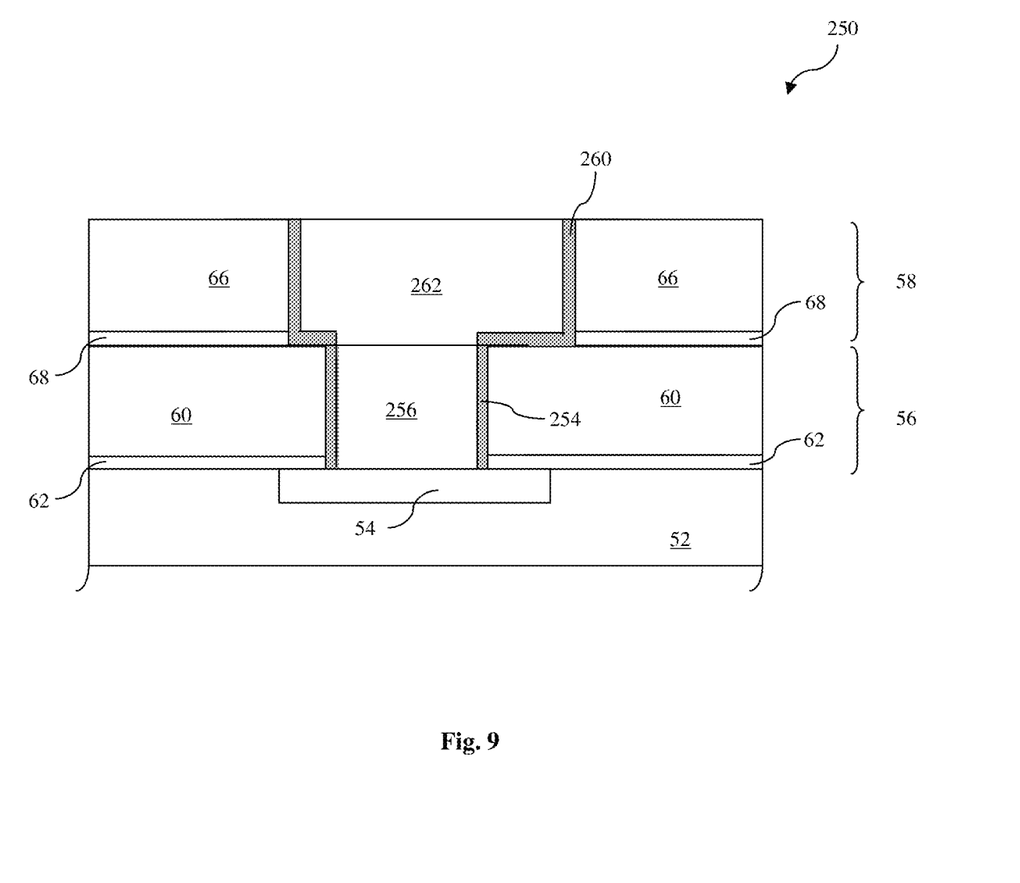

Referring to FIG. 9, a barrier layer 260 is disposed on sidewalls of the trench 258. In the present embodiment, the barrier layer 260 is similar to the barrier layer 72 of FIG. 1 in terms of composition and formation. In one example, the barrier layer 260 includes TaN, Ta or a combination thereof. The barrier layer 260 may be formed by PVD, CVD, or other suitable technique. Alternatively, the barrier layer 260 disposed on the bottom surface of the trench 258 is selectively removed by a dry etch or a patterning process including lithography and etching.

A second composite metal feature 262 includes a plurality of metal layers and a plurality of graphene layers configured such that each graphene layer is interposed between the two neighbor metal layers, as illustrated in FIG. 3. Particularly, in the present embodiment, the outmost layer of the composite metal feature 262 is one of the metal layers 80. The second composite metal feature 262 and barrier layer 260 are similar to the second conductive feature 70 of FIG. 3 in terms of composition, formation and configuration.

Various advantages may present in one or more embodiments of the semiconductor structure and the corresponding method. In one example, as CNTs and graphene are good conductive materials, the overall conductivity and further the reliability of the semiconductor structure are enhanced.

Thus, the present disclosure provides an integrated circuit (IC) structure. The IC structure includes a substrate having an IC device formed therein; a first dielectric material layer disposed on the substrate and having a first trench formed therein; and a first composite interconnect feature disposed in the first trench and electrically coupled with the IC device. The first composite interconnect feature includes a first barrier layer disposed on sidewalls of the first trench; a first metal layer disposed on the first barrier layer; and a first graphene layer disposed on the metal layer.

In one embodiment, the first composite interconnect feature further includes a second metal layer disposed on the first graphene layer; and a second graphene layer disposed on the second metal layer. The first metal layer has a first thickness and the second metal layer has a second thickness. The second thickness may be less than the first thickness. In one embodiment, the substrate includes a semiconductor substrate; the first dielectric material layer includes at least one of silicon oxide and a low-k dielectric material; and the first metal layer includes one of copper and tungsten. In another embodiment, the IC structure further includes an etch stop layer interposed between the substrate and the dielectric layer. The IC structure may further include a second dielectric material layer interposed between the first dielectric material layer and the substrate, having a second trench formed in the second dielectric material layer; and a second composite interconnect feature formed in the second trench and contacted with the first composite interconnect feature. The second composite interconnect feature includes a second barrier layer disposed on sidewalls of the second trench; at least one carbon nanotube disposed in the second trench; and a metal material filled in the second trench and surrounded by the second barrier layer such that the at least one carbon nanotube is embedded in the metal material. In another embodiment, the first interconnect feature is a metal line; the second composite interconnect feature is one of via and contact; and the first composite interconnect feature is coupled to the IC device through the second interconnect feature. The second composite interconnect feature may contact a salicide feature of the IC device. The first barrier layer may include graphene. In another embodiment, the first barrier layer includes a titanium nitride (TiN) layer on the sidewalls of the first trench and a ruthenium (Ru) layer on the TiN layer; and the first graphene layer is interposed between the Ru layer and the first metal layer.

The present disclosure also provides another embodiment of an IC structure. The IC structure includes a semiconductor substrate having an IC device formed therein; a first dielectric material layer disposed on the substrate and having a trench formed therein; and a first composite interconnect feature disposed in the trench and electrically coupled with the IC device. The first composite interconnect feature includes a first barrier layer disposed on sidewalls of the trench; at least one carbon nanotube disposed in the first and substantially oriented along a depth direction of the trench; and a copper material filled in the first trench and separated from the first dielectric material layer by the barrier layer such that the at least one carbon nanotube is embedded in the copper material.

In one embodiment, the IC structure further includes a second dielectric material layer disposed on the first dielectric material layer; and a second composite interconnect feature embedded in the second dielectric material layer and contacting the first composite interconnect feature, in which the second composite interconnect feature includes a plurality of metal layers including a first metal layer approximate the second dielectric material layer; and a plurality of graphene layers each being interposed between two neighbor metal layers. In another embodiment, the second composite interconnect feature further includes a second barrier layer interposed between the second dielectric material layer and the first metal layer. In yet another embodiment, the IC structure further includes a first etch stop layer interposed between the first and second dielectric material layers; and a second etch stop layer interposed between the first and semiconductor substrate. Each of the plurality of metal layers may include at least one of copper and tungsten.

The present disclosure also provides one embodiment of a method. The method includes forming a first dielectric material layer on a substrate having an integrated circuit (IC) device formed therein; etching the first dielectric material layer to form a first trench aligned with a device feature of the IC device; forming a barrier layer in the first trench; forming a first metal layer within the first trench and adjacent the barrier layer; and forming a first graphene layer within the first trench and adjacent the first metal layer.

In one embodiment, the method further includes forming a first etch stop layer on the substrate before forming a first dielectric material layer. In furtherance of the embodiment, etching the first dielectric material layer includes forming an etch mask layer having an opening defining a region for the first trench; performing a first etchings step to etch the first dielectric material layer within the opening of the etch mask; and performing a second etchings step to etch the first etch stop first layer within the opening of the etch mask layer. In another embodiment, the method further includes forming a second metal layer within the first trench and adjacent the first graphene layer and remote from the first metal layer; and forming a second graphene layer within the first trench and adjacent the second metal layer and remote from the first graphene layer. In yet another embodiment, the method further includes performing a chemical mechanical polishing (CMP) process to remove the barrier layer, the first metal layer and the first graphene layer on the first dielectric material layer. In yet another embodiment, the method further includes forming a second dielectric material layer on the first dielectric material layer; etching the second dielectric material layer to form a second trench aligned with the first trench such that the second trench at least partially lands on the first trench; forming another barrier layer in the second trench and adjacent sidewalls of the second trench; forming an carbon nanotube (CNT) in the second trench and substantially oriented along a direction perpendicular to the substrate; and thereafter forming copper in the second trench such that the copper fills in gaps between the CNT and the another barrier layer. In yet another embodiment, the forming a first metal layer includes forming a copper layer by chemical vapor deposition; and the forming a first graphene layer includes forming the first graphene layer by CVD. The forming a first metal layer and the forming a first graphene layer may include forming the first metal layer and the first graphene layer in a same CVD tool.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. An integrated circuit (IC) structure, comprising:
a substrate having an IC device formed therein;
a first dielectric material layer disposed over the substrate and having a first trench formed therein;
a first composite interconnect feature disposed in the first trench and electrically coupled with the IC device, wherein the first composite interconnect feature includes
a first barrier layer disposed on sidewalls of the first trench;
a first metal layer disposed on the first barrier layer; and
a first graphene layer disposed on the first metal layer;

a second dielectric material layer interposed between the first dielectric material layer and the substrate, having a second trench formed in the second dielectric material layer; and a second composite interconnect feature formed in the second trench and contacted with the first composite interconnect feature, wherein the second composite interconnect feature includes a second barrier layer disposed on sidewalls of the second trench;

at least one carbon nanotube disposed in the second trench; and a metal material filled in the second trench and surrounded by the second barrier layer such that the at least one carbon nanotube is embedded in the metal material.

2. The IC structure of claim 1, wherein the first composite interconnect feature further includes a second metal layer disposed on the first graphene layer; and a second graphene layer disposed on the second metal layer.

3. The IC structure of claim 2, wherein the first metal layer has a first thickness; and the second metal layer has a second thickness less than the first thickness.

4. The IC structure of claim 1, wherein the substrate includes a semiconductor substrate;

the first dielectric material layer includes at least one of silicon oxide and a low-k dielectric material; and the first metal layer includes one of copper and tungsten.

5. The IC structure of claim 1, further comprising an etch stop layer interposed between the substrate and the first dielectric layer.

6. The IC structure of claim 1, wherein the first interconnect feature is a metal line;

the second composite interconnect feature is one of via and contact; and the first composite interconnect feature is coupled to the IC device through the second interconnect feature.

7. The IC structure of claim 6, wherein the second composite interconnect feature contacts a salicide feature of the IC device.

8. The IC structure of claim 1, wherein the first barrier layer includes graphene.

9. The IC structure of claim 8, wherein the first barrier layer includes a titanium nitride (TiN) layer on the sidewalls of the first trench and a ruthenium (Ru) layer on the TiN layer; and the first graphene layer is interposed between the Ru layer and the first metal layer.

10. An integrated circuit (IC) structure, comprising:

a semiconductor substrate having an IC device formed therein;

a first dielectric material layer disposed on the substrate and having a trench formed therein; and a first composite interconnect feature disposed in the trench and electrically coupled with the IC device, wherein the first composite interconnect feature includes a first barrier layer disposed on sidewalls of the trench;

at least one carbon nanotube disposed in the trench and substantially oriented along a depth direction of the trench; and a copper material filled in the trench and separated from the first dielectric material layer by the barrier layer such that the at least one carbon nanotube is embedded in the copper material.

11. The IC structure of claim 10, further comprising:

a second dielectric material layer disposed on the first dielectric material layer; and a second composite interconnect feature embedded in the second dielectric material layer and contacting the first composite interconnect feature, wherein the second composite interconnect feature includes a plurality of metal layers including a first metal layer approximate the second dielectric material layer; and a plurality of graphene layers each being interposed between two neighbor metal layers.

12. The IC structure of claim 11, wherein the second composite interconnect feature further includes a second barrier layer interposed between the second dielectric material layer and the first metal layer.

13. An IC structure comprising:

a substrate including a feature;

a first interconnect layer over the substrate and including a first trench in a first dielectric layer, the first trench extending to the feature; and a second interconnect layer over the first interconnect layer with a second trench in a second dielectric layer, the second trench extending to the first trench, wherein the first trench includes a plurality of carbon nanotubes (CNTs) extending between the feature and the second trench, and a first conducting material surrounding the CNTs; and wherein the second trench includes a plurality of alternating layers of a second conducting material and graphene.

14. The IC structure of claim 13, wherein:

the CNTs are in direct contact with the feature.

* * * * *